(12) United States Patent
Hatakeyama et al.

(10) Patent No.: US 9,663,861 B2
(45) Date of Patent: May 30, 2017

(54) ACOUSTIC WAVE DEVICE AND METHOD FOR MANUFACTURING THE SAME

(71) Applicant: TAIYO YUDEN CO., LTD., Tokyo (JP)

(72) Inventors: Kazushige Hatakeyama, Tokyo (JP); Hitoshi Tsukidate, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/008,051

(22) Filed: Jan. 27, 2016

(65) Prior Publication Data

US 2016/0286311 A1 Sep. 29, 2016

(30) Foreign Application Priority Data

Mar. 23, 2015 (JP) ................................. 2015-059950

(51) Int. Cl.
| | |
|---|---|
| *H03H 9/25* | (2006.01) |
| *H03H 9/64* | (2006.01) |
| *H03H 3/08* | (2006.01) |
| *C23C 18/16* | (2006.01) |
| *C25D 7/12* | (2006.01) |
| *C23C 18/42* | (2006.01) |

(52) U.S. Cl.
CPC .......... *C23C 18/1633* (2013.01); *C25D 7/123* (2013.01); *H03H 3/08* (2013.01); *H03H 9/25* (2013.01); *H03H 9/64* (2013.01); *C23C 18/1653* (2013.01); *C23C 18/42* (2013.01)

(58) Field of Classification Search
CPC ........ H03H 9/059; H03H 9/25; H03H 9/1092; H03H 9/0542; H03H 9/1071; H03H 9/64; H03H 9/0296; H03H 9/0576; H03H 9/1007; H03H 9/1064; H03H 3/02; H03H 3/08; H03B 5/326; C23C 18/1633; C23C 18/1653; C23C 18/42; C25D 7/123; H01L 41/0475; H04R 19/005
See application file for complete search history.

(56) References Cited

U.S. PATENT DOCUMENTS

| | | | |
|---|---|---|---|
| 6,060,381 A | | 5/2000 | Nakagawara et al. |
| 2002/0101304 A1* | | 8/2002 | Onishi ................... H03H 9/059 333/193 |

(Continued)

FOREIGN PATENT DOCUMENTS

| | | |
|---|---|---|
| JP | 7-321425 A | 12/1995 |
| JP | 2005-109060 A | 4/2005 |

(Continued)

*Primary Examiner* — Thang Tran
(74) *Attorney, Agent, or Firm* — Chen Yoshimura LLP

(57) ABSTRACT

An acoustic wave device includes: a substrate; an acoustic wave element that is formed on the substrate; a first wiring that is formed on the substrate and electrically connected to the acoustic wave element; a second wiring that is formed above the substrate via an air gap, and includes an edge fixed to the first wiring; a fixer that is formed on an edge of the first wiring, projects upwardly, and is fixed to the second wiring; and a projection that contacts the fixer, projects upwardly, and is formed on the edge of the first wiring and on an outside of the second wiring in a direction intersecting an extension direction of the second wiring.

8 Claims, 13 Drawing Sheets

(56) References Cited

U.S. PATENT DOCUMENTS

| | | | |
|---|---|---|---|
| 2002/0121841 A1* | 9/2002 | Shimoe | H03H 3/08 29/25.35 |
| 2004/0178698 A1* | 9/2004 | Shimoe | H03H 3/08 310/313 R |
| 2004/0207033 A1* | 10/2004 | Koshido | H03H 3/08 257/415 |
| 2009/0175470 A1* | 7/2009 | Aikawa | H04R 17/00 381/190 |
| 2010/0019867 A1* | 1/2010 | Tsuda | H03H 3/08 333/193 |
| 2013/0076205 A1* | 3/2013 | Kurihara | H03H 3/08 310/313 B |
| 2014/0003196 A1* | 1/2014 | Tajima | H03H 9/0547 367/140 |
| 2014/0118093 A1* | 5/2014 | Yamashita | H03H 9/25 333/187 |
| 2014/0320234 A1* | 10/2014 | Takemura | H03H 9/64 333/133 |
| 2016/0173060 A1* | 6/2016 | Hatakeyama | H03H 3/08 333/195 |

FOREIGN PATENT DOCUMENTS

| | | |
|---|---|---|
| JP | 2006-278431 A | 10/2006 |
| JP | 2012-9989 A | 1/2012 |

\* cited by examiner

ACOUSTIC WAVE DEVICE AND METHOD FOR MANUFACTURING THE SAME

CROSS-REFERENCE TO RELATED APPLICATION

This application is based upon and claims the benefit of priority of the prior Japanese Patent Application No. 2015-059950, filed on Mar. 23, 2015, the entire contents of which are incorporated herein by reference.

FIELD

A certain aspect of the present invention relates to an acoustic wave device and a method for manufacturing the same, e.g. to an acoustic wave device and a method for manufacturing the same that have a wiring formed on a substrate through an air gap.

BACKGROUND

An acoustic wave device is used for a mobile communication filter, or the like. It is known that wirings connected between elements such as acoustic wave elements formed on a substrate or wirings connected between an element and an external terminal formed on the substrate are made to intersect via an air gap (see Japanese Laid-open Patent Publication Nos 7-321425, 2005-109060, 2006-278431, and 2012-9989).

When the wirings are made to intersect via the air gap, a parasitic capacitance between the wirings can be reduced. However, in a process for grinding a rear side of the substrate and a lift-off process of a wiring for example, the wiring may be damaged when a pressure is applied to the wiring.

SUMMARY OF THE INVENTION

According to an aspect of the present invention, there is provided an acoustic wave device including: a substrate; an acoustic wave element that is formed on the substrate; a first wiring that is formed on the substrate and electrically connected to the acoustic wave element; a second wiring that is formed above the substrate via an air gap, and includes an edge fixed to the first wiring; a fixer that is formed on an edge of the first wiring, projects upwardly, and is fixed to the second wiring; and a projection that contacts the fixer, projects upwardly, and is formed on the edge of the first wiring and on an outside of the second wiring in a direction intersecting an extension direction of the second wiring.

DETAILED DESCRIPTION

Hereinafter, a description will be given of a present invention with reference to drawings.

First Embodiment

Figure 1A:
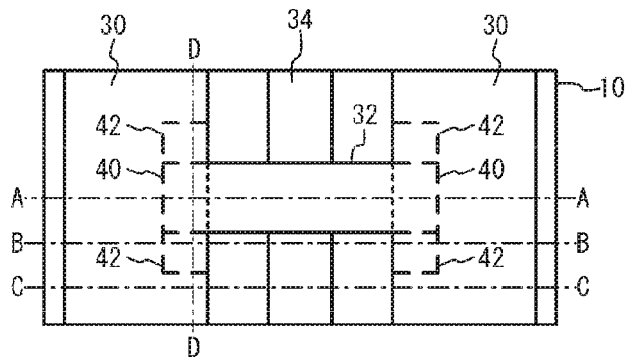
FIG. 1A is a plane view of wirings according to a first embodiment.

FIG. 1A is a plane view of wirings according to a first embodiment. FIGS. 1B to 1E are cross-section views taken along a line A-A, a line B-B, a line C-C and a line D-D of FIG. 1A, respectively.

As illustrated in FIGS. 1A to 1E, wirings 30, 32 and 34 are formed on a substrate 10. The wiring 32 connects the wirings 30 to each other, and is formed above the substrate 10 and the wiring 34 via an air gap 24. Each of the wirings 30 has a metal film 12, a seed layer 16 and a plating layer 22 formed on the substrate 10. The plating layer 22 includes a lower layer 18 and an upper layer 20. The wiring 32 is fixed to the wirings 30, and shares the seed layer 16 and the plating layer 22 with the wirings 30. The wiring 34 has the metal film 12. The wirings 30, 32 and 34 are electrically connected between acoustic wave elements formed on the substrate 10 or between an acoustic wave element and a pad formed on the substrate 10.

Figure 1B:
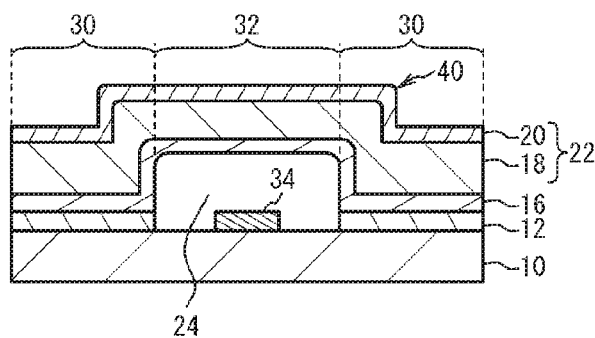
FIGS. 1B to 1E are cross-section views taken along a line A-A, a line B-B, a line C-C and a line D-D of FIG. 1A, respectively.
Figure 1E:
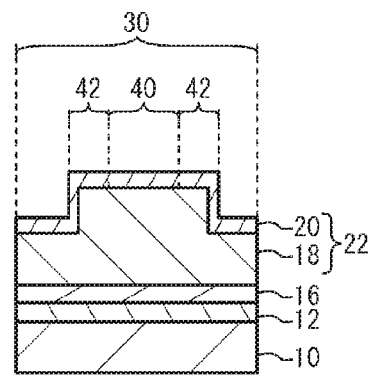
Figure 1C:
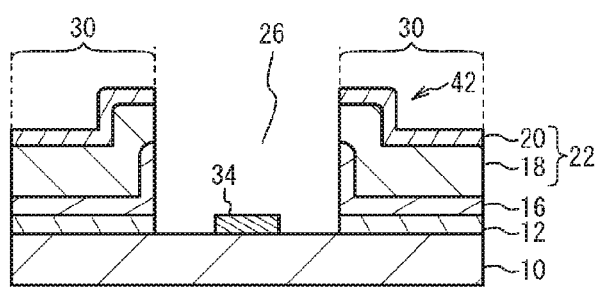
Figure 1D:
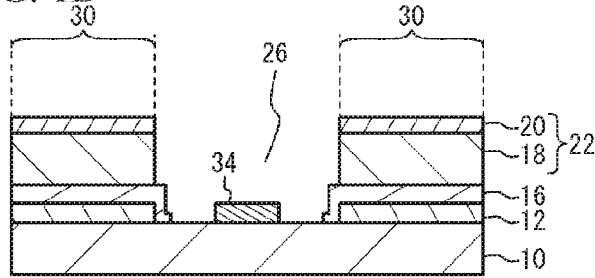

In an edge of each wiring 30, a fixer 40 to which the wiring 32 is fixed projects upwardly, as illustrated in FIGS. 1B and 1E. In the edge of the wiring 30, projections 42 which project upwardly are provided in contact with the fixer 40. Here, a direction indicated by the term "upwardly" is a direction away from the substrate vertically. Upper surfaces of the projections 42, the fixer 40 and the wiring 32 have almost the same height, and are formed continuously. A space 26 is formed between the wirings 30. In a side surface of each of the projections 42 to be exposed to the space 26, the seed layer 16 extends upwardly. As illustrated in FIGS. 1D and 1E, upper surfaces of edges of each wiring 30 located on the outside of the projections 42 have the same height as an upper surface of a central portion of each wiring 30, and are flat. In the side surface of each wiring 30, the seed layer 16 extends toward the space 26, compared with the plating layer 22.

Figure 2A:
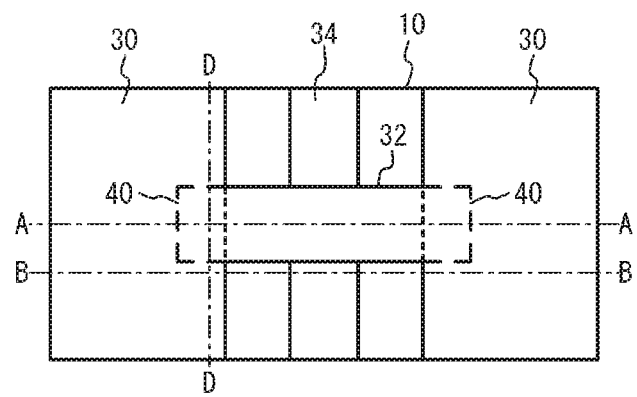
FIG. 2A is a plane view of wirings according to a first comparative example.
Figure 2B:
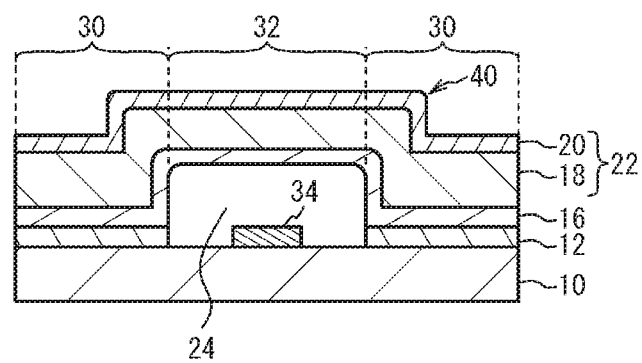
FIGS. 2B to 2D are cross-section views taken along a line A-A, a line B-B and a line D-D of FIG. 2A, respectively.
Figure 2C:
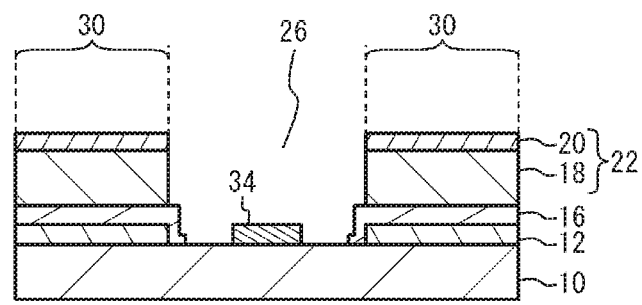
Figure 2D:
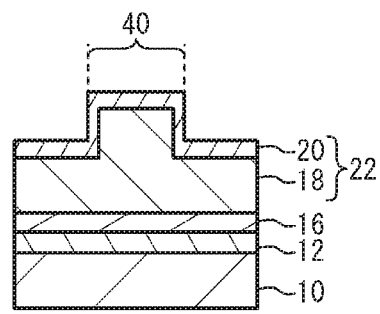

Next, a description will be given of a comparative example. FIG. 2A is a plane view of wirings according to a first comparative example. FIGS. 2B to 2D are cross-section views taken along a line A-A, a line B-B and a line D-D of FIG. 2A, respectively. In the first comparative example, fixers 40 are formed at places where the wiring 32 is connected to the wirings 30, as illustrated in FIGS. 2A to 2D. However, the projections 42 are not formed on both sides of each fixer 40. Since other configurations are the same as corresponding configurations of the first embodiment, a description thereof is omitted.

The wiring 32 is located above the wiring 34 via the air gap 24 so as to intersect the wiring 34, as illustrated in the first embodiment and the first comparative example. Therefore, the upper surface of the wiring 32 is higher than the upper surfaces of the wirings 30 by almost the height of the air gap 24. As with the wiring 32, the upper surface of the fixer 40 is higher than the upper surfaces of the wirings 30. In the first comparative example, when a pressure is applied to the wiring 32, the wiring 32 may be damaged. For example, when the wiring 32 is formed by a lift-off method, the wiring 32 may be damaged by an ultrasonic wave or a high-pressure jet of a lift-off process. For example, in a process for grinding or polishing a rear surface (i.e., a lower surface) of the substrate, a masking tape is pasted on a surface (i.e., an upper surface) of the substrate. After grinding or polishing the back surface of the substrate is finished, the masking tape is peeled. At this time, the wiring 32 may be damaged. Moreover, when the rear surface of the substrate is ground or polished by a grinder or a polisher, a pressure is applied to the substrate up and down. The wiring 32 may be damaged by the pressure. Thus, in a manufacturing process subsequent to the formation of the wiring or after implementation, the wiring 32 may be damaged. The damage of the wiring 32 causes a defect of the acoustic wave device, which can be factors of reduction of yield and occurrence of a failure.

According to the first embodiment, the projections 42 contact the fixer 40, and are formed on the outsides of the wiring 32 in a direction intersecting an extension direction of the wiring 32, as seen from the extension direction of the wiring 32 (i.e., as seen from above in FIG. 1A). Thereby, the projections 42 reinforce the wiring 32, and hence the damage of the wiring 32 as explained in the first comparative example can be suppressed. Since the projections 42 receive the pressure from above for example, the damage of the wiring 32 can be suppressed. Moreover, the projections 42 reduce a shearing stress which the fixer 40 receives by a pressure from a lateral side.

Figure 3A:
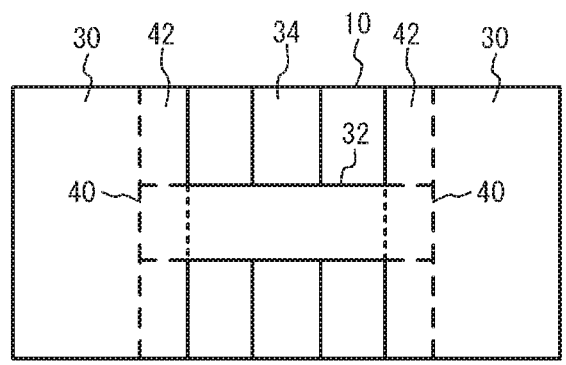
FIGS. 3A and 3B are plane views of wirings according to first and second variation examples of the first embodiment.
Figure 3B:
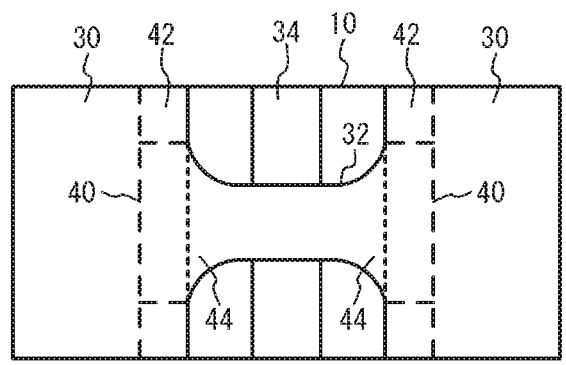

FIGS. 3A and 3B are plane views of wirings according to first and second variation examples of the first embodiment. Each projection 42 may be formed on the whole of one edge of the wiring 30, as illustrated in FIG. 3A. Thereby, the strength of the wiring 32 can be increased. As described later in a second embodiment, when the wiring 32 is formed by the lift-off method, the lift-off becomes difficult if there are many projections 42. In such a case, the projection 42 is preferably formed on a part of the edge of the wiring 30. Moreover, the projection 42 may be formed on a side of the wiring 30 to which the wiring 32 is fixed, without being formed on the other sides of the wiring 30.

As illustrated in FIG. 3B, a wide width portion 44 of the wiring 32 is formed on a root where the wiring 32 is connected to the wiring 30. The wide width portion 44 increases the width smoothly toward the wiring 30 so that a stress disperses. The wiring 32 can be also reinforced by the wide width portion 44. The wiring 32 may mechanically resonate in a frequency of a wavelength having an integral multiple of a frequency in the vicinity of a resonance frequency of an acoustic wave element (e.g. in the vicinity of a pass band of a filter when the acoustic wave element is the filter). The wiring 32 may be damaged by receiving mechanical resonance vibration. By the projection 42 of the first embodiment and the first variation example, and the wide width portion 44 of the second variation example of the first embodiment, the reduction of strength of the wiring 32 can be suppressed, and the damage of the wiring 32 can be suppressed. Therefore, the reliability of the acoustic wave device can be improved.

Second Embodiment

Figure 4:
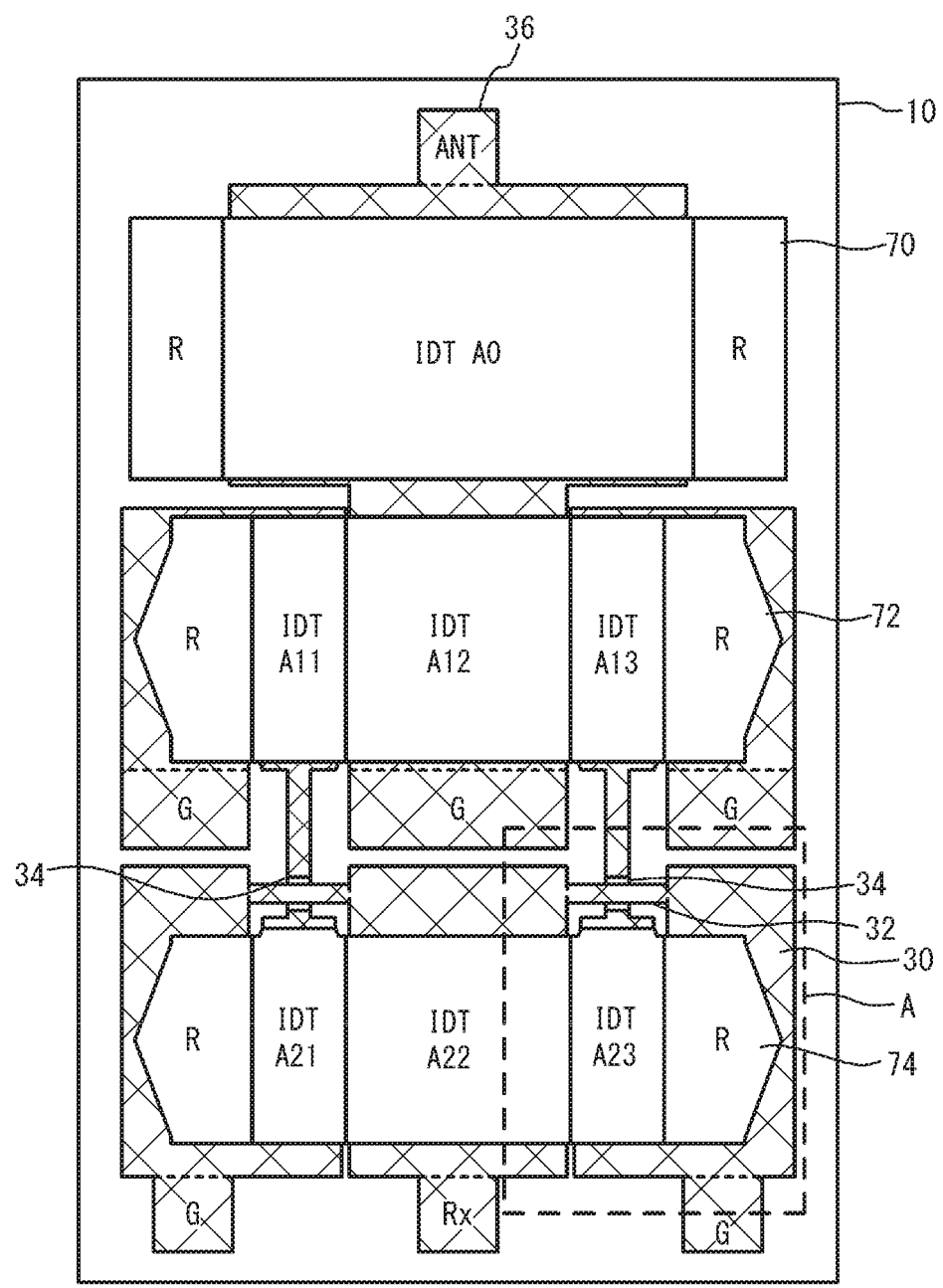
FIG. 4 is a plane view of an acoustic wave device according to a second embodiment.

A second embodiment indicates an example in which a receiving filter is composed of surface acoustic wave elements. FIG. 4 is a plane view of an acoustic wave device according to the second embodiment. The substrate 10 is a piezoelectric substrate, for example. Acoustic wave elements 70, 72 and 74 are formed on the substrate 10. The acoustic wave elements 70, 72 and 74 are surface acoustic wave elements, for example. The acoustic wave element 70 is a resonator having a pair of terminals, and includes an IDT (Interdigital Transducer) A0 and reflectors R provided on both sides of the IDT A0. The acoustic wave element 72 is a DMS (Double Mode Surface acoustic wave) filter, and includes three IDTs A11 to A13 and reflectors R. The acoustic wave element 74 is the DMS (Double Mode Surface acoustic wave) filter, and includes three IDTs A21 to A23 and reflectors R. The wiring 30 connects the acoustic wave elements 70 to 74 to each other, or connects the acoustic wave elements 70 to 74 and pads 36 to each other. The pads 36 are an antenna terminal ANT, a receiving terminal Rx and ground terminals G, and electrically connect the acoustic wave elements 70 to 74 to the outside of the substrate 10.

A pad 36 which is the antenna terminal ANT is connected to one end of the IDT A0 of the acoustic wave element 70 via the wiring 30. The other end of the IDT A0 is connected to one end of an IDT A12 of the acoustic wave element 72 via the wiring 30. One ends of the IDTs A11 and A13 are connected to one ends of the IDTs A21 and A23 via two set of the wirings 30 and 34, respectively. One end of the IDT A22 is connected to a pad 36 which is the receiving terminal Rx, via the wiring 30. The ground terminals G are connected to the reflectors R and the other ends of the IDTs A11 to A23 via the wiring 30 (here, the wiring 32 is additionally used when the ground terminal G is connected to the other end of the IDT A22). The second embodiment indicates the receiving filter in which the DMS filters are connected in a two-stage form.

Figure 5:
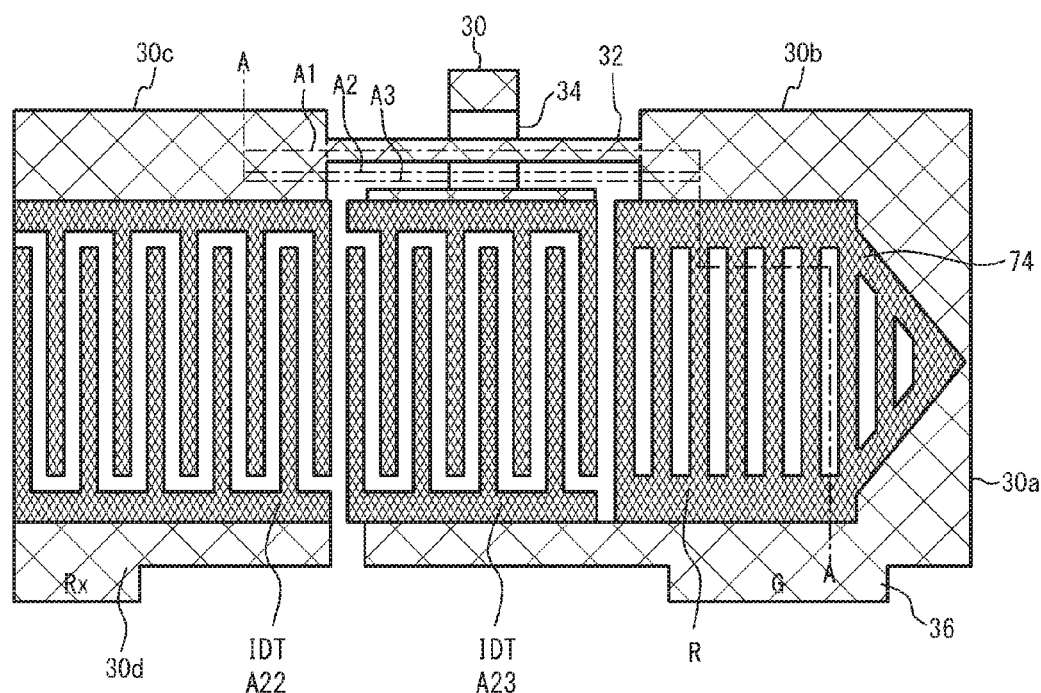
FIG. 5 is a plane view enlarging an area A of FIG. 4.

FIG. 5 is a plane view enlarging an area A of FIG. 4. As illustrated in FIG. 5, the other end of the IDT A22 is connected to the ground terminal G via wirings 30C, 32, 30b and 30a. One end of the IDT A22 is connected to the receiving terminal Rx via a wiring 30d. One end of the IDT A23 is connected to the one end of the IDT A13 via the wirings 30 and 34.

Figure 6A:
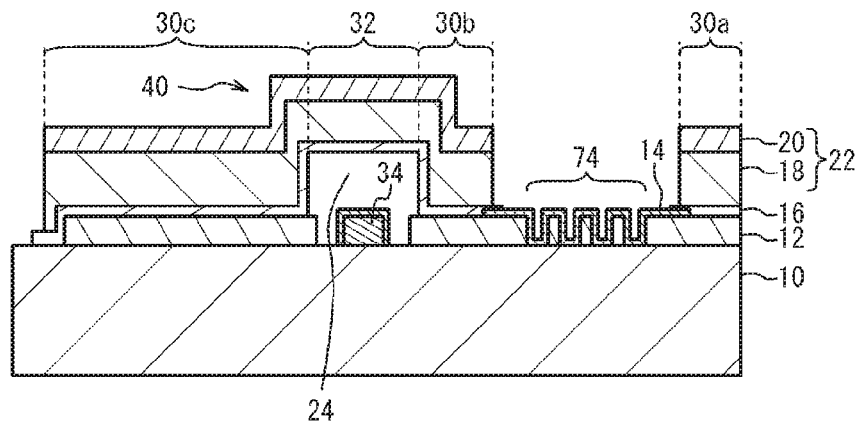
FIGS. 6A to 6C are cross-section views taken along a line A-A of FIG. 5.
Figure 6B:
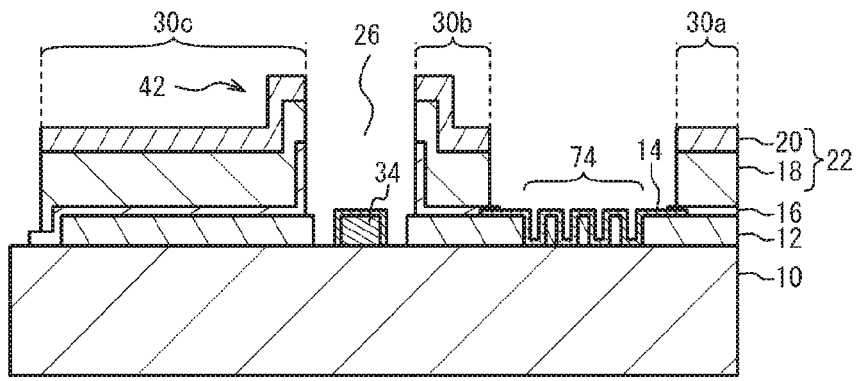
Figure 6C:
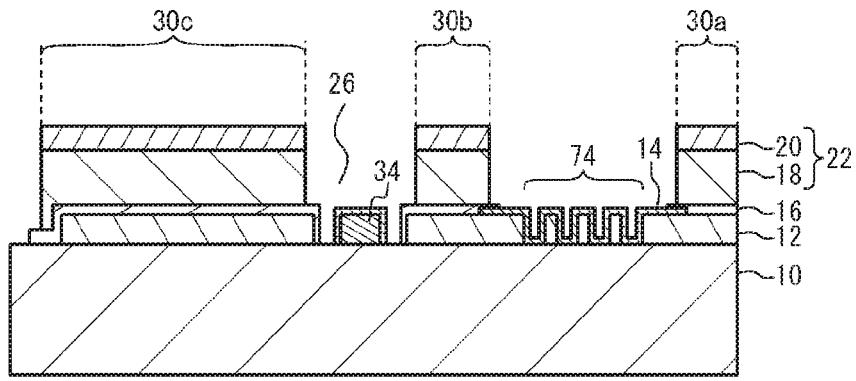

FIGS. 6A to 6C are cross-section views taken along a line A-A of FIG. 5. Specifically, FIGS. 6A to 6C are cross-section views taken along lines A1 to A3, respectively. As illustrated in FIG. 6A, the wiring 32 is formed above the wiring 34 via the air gap 24. The edges of the wirings 30b and 30c to which the wiring 32 is fixed project upwardly and form the fixers 40. As illustrated in FIG. 6B, in the vicinity of the wiring 32, the wiring 32 is not formed and the space 26 is formed between the wirings 30b and 30c. The projections 42 are formed on the edges of the wirings 30b and 30c. As illustrated in FIG. 6C, the projections 42 are not formed on a place away from the wiring 32.

Figure 7A:
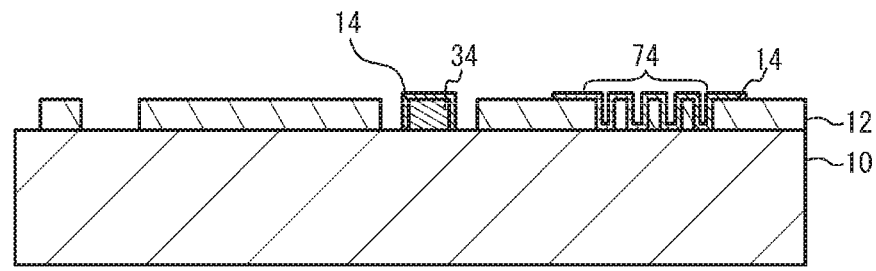
FIGS. 7A to 7C are cross-section views illustrating a method for manufacturing an acoustic wave device according to a second embodiment (part 1)

FIGS. 7A to 12C are cross-section views illustrating a method for manufacturing an acoustic wave device according to a second embodiment. FIGS. 7A to 8C correspond to cross-section views taken along the line A1 of FIG. 5. As illustrated in FIG. 7A, the metal film 12 is formed on the substrate 10. The substrate 10 is the piezoelectric substrate such as a lithium tantalate substrate or a lithium niobate substrate, for example. The metal film 12 is an aluminum film, for example. The metal film 12 is formed using a sputtering method and an etching method, for example. The acoustic wave element 74 having the IDT and the reflectors is formed by the metal film 12. A film thickness of the metal film 12 is 150 nm to 400 nm, for example. The metal film 12 may be a copper film, a gold film, or the like. The wiring 34 and a partial layer of other wirings are formed by the metal film 12. A protective film 14 is formed on the acoustic wave element 74 and the wiring 34. The protective film 14 is a silicon oxide film having a film thickness of 20 nm, for example. The protective film 14 is formed using the sputtering method and the etching method, for example.

Figure 7B:
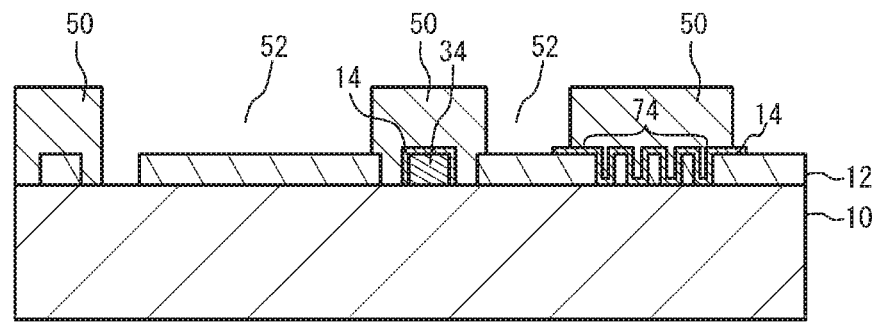

As illustrated in FIG. 7B, a mask layer 50 is formed on the substrate 10 so that an opening 52 is formed on a region for forming the wiring. The opening 52 is formed on the region for forming the wiring 30. The mask layer 50 is a photoresist, for example, and is formed using a photolithography method. The film thickness of the mask layer 50 is set so that a desired resolution is obtained in the photolithography method. The film thickness of the mask layer 50 is preferably 2 μm or more in order to perform the lift-off of the seed layer 16 mentioned later. The mask layer 50 preferably has heat resistance of a degree that can withstand subsequent baking.

Figure 7C:
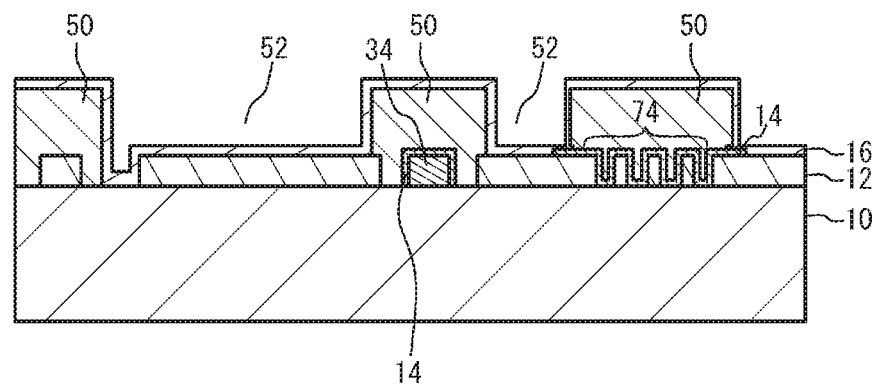

As illustrated in FIG. 7C, the seed layer 16 is formed on the whole face of the substrate 10 so as to cover the mask layer 50. The seed layer 16 includes, for example, a titanium film having a film thickness of 0.2 μm and a gold film having a film thickness of 0.15 μm, and the titanium film is closer to the substrate 10 as compared with the gold film. The seed layer 16 is formed using a vapor deposition method, for example. The seed layer 16 may include a titanium film having a film thickness of 0.1 μm and a copper film having a film thickness of 0.3 μm, and the titanium film may be closer to the substrate 10 as compared with the copper film. The seed layer 16 may be formed using the sputtering method, but the seed layer 16 is preferably formed using the vapor deposition method since the lift-off method is used. A film in the seed layer 16 near the substrate 10 is an adhesive film improving adhesion with the metal film 12. When the metal film is the aluminum film, the adhesive film is the titanium film, for example. An upper film of the seed layer 16 functions as a seed of plating, and has preferably the same materials as a plating layer.

Figure 8A:
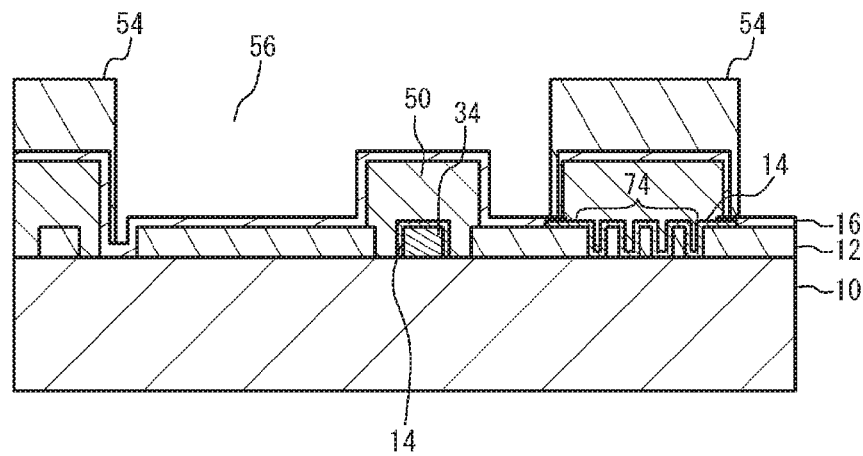
FIGS. 8A to 8C are cross-section views illustrating the method for manufacturing the acoustic wave device according to the second embodiment (part 2)

As illustrated in FIG. 8A, a mask layer 54 is formed on the seed layer 16 so that an opening 56 is formed on a region for forming the wiring. The mask layer 54 is a photoresist film having a film thickness of 7 μm, for example. The mask layer 54 is the photoresist, for example, and is formed using the photolithography method. The film thickness of the mask layer 54 is set so as to cover steps of the seed layer 16 and become thicker than the plating layer 22. The film thickness of the mask layer 54 is 5 μm to 20 μm, for example. The opening 56 is smaller than the opening 52, and is formed so as to be included in the opening 52. Moreover, the opening 56 is formed so as to include the mask layer 50 for forming the wiring 32.

Figure 8B:
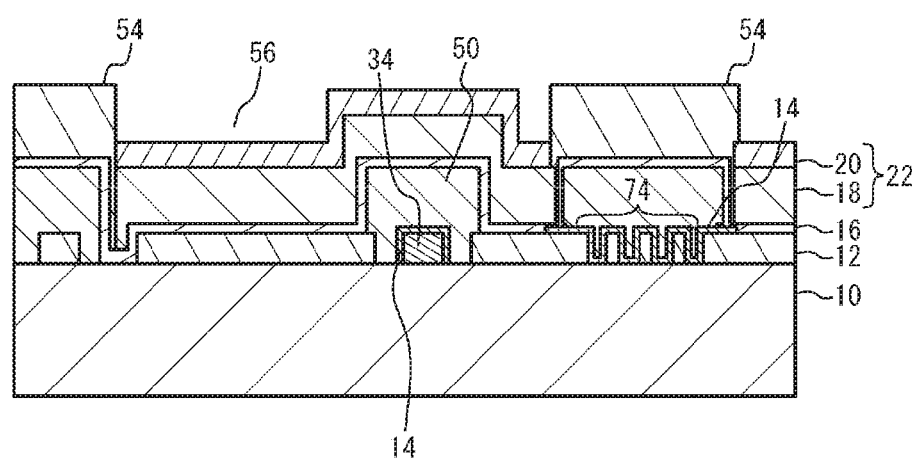

As illustrated in FIG. 8B, the plating layer 22 is formed in the opening 56. The plating layer 22 includes the lower layer 18, a barrier layer (not shown), and the upper layer 20 that are laminated from a substrate side in this order. The lower layer 18 is a copper layer having a film thickness of 3 μm, for example. The barrier layer is a palladium layer having a film thickness of 0.3 μm, for example. The upper layer 20 is a gold layer having a film thickness of 1 μm, for example. The plating layer 22 is formed by using a current supplied from the seed layer and an electrolytic plating method. The lower layer 18 can increase the film thickness, and is preferably composed of a material having a low electric resistivity and nonmagnetism. Therefore, the lower layer 18 is preferably a copper layer or a gold layer. In order to make the resistance of the wirings 30 and 32 low, the film thickness of the lower layer 18 is preferably 1 μm or more, for example. When a stud bump is formed on the plating layer 22, the upper layer 20 is preferably a gold layer. The barrier layer suppresses mutual diffusion in accordance with the heating of the lower layer 18 and the upper layer 20 or a change with the elapse of time. When the lower layer 18 is the copper layer and the upper layer 20 is the gold layer, the barrier layer is preferably a palladium layer or a nickel layer that has a film thickness of about 0.2 μm. The upper layer 20 can be formed using an electroless plating method. In this case, the film thickness of the upper layer 20 is 0.4 μm, for example. Moreover, the barrier layer and the upper layer 20 can be formed using the vapor deposition method. In this case, the barrier layer is a titanium layer having a film thickness of 0.2 μm, and the upper layer 20 is a gold layer having a film thickness of 0.4 μm, for example.

Figure 8C:
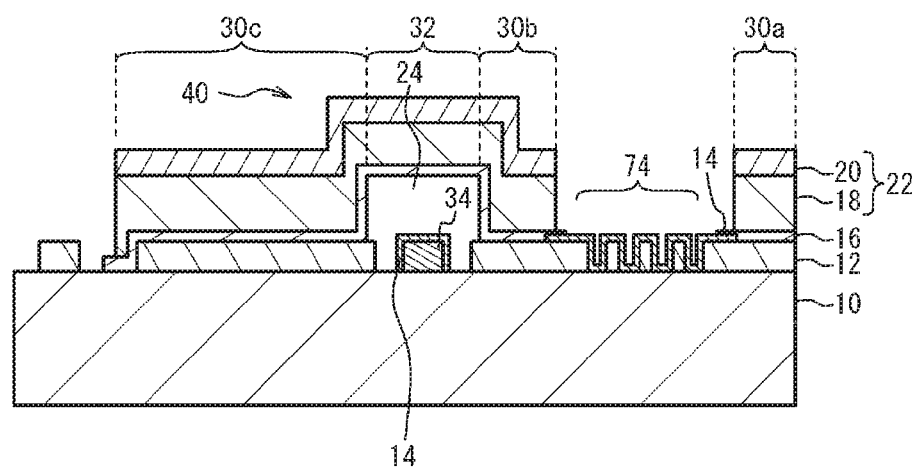

As illustrated in FIG. 8C, the mask layers 50 and 54 are removed using an organic solvent, for example. At this time, the seed layer 16 formed between the mask layers 50 and 54 is lifted off. For the lift-off of the seed layer 16, the organic solvent may be jetted at a high pressure. Moreover, ultrasonic cleaning may be performed in the organic solvent. Thereby, the wirings 30a to 30c are formed from the metal film 12, the seed layer 16 and the plating layer 22. The wiring 32 is formed above the wiring 34 and from the seed layer 16 and the plating layer 22. Then, a terminal such as the stud bump is formed on the pad 36. The rear surface of the substrate 10 is ground or polished.

Figure 9A:
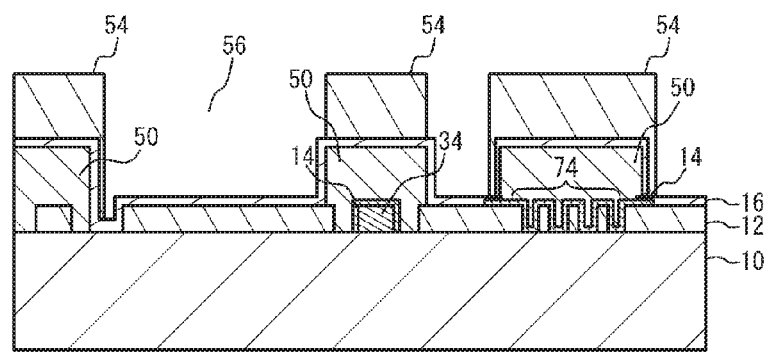
FIGS. 9A to 9C are cross-section views illustrating the method for manufacturing the acoustic wave device according to the second embodiment (part 3)
Figure 9B:
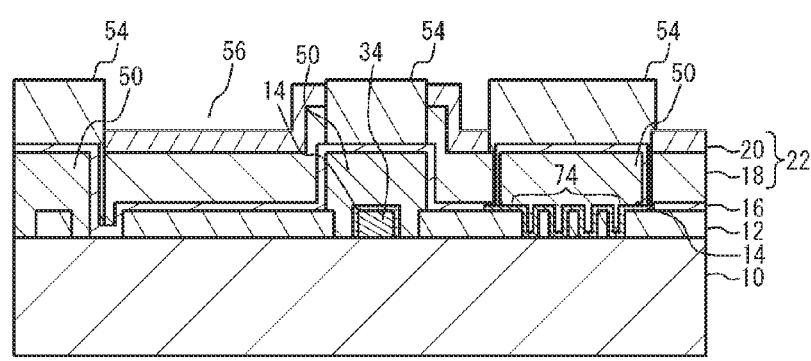
Figure 9C:
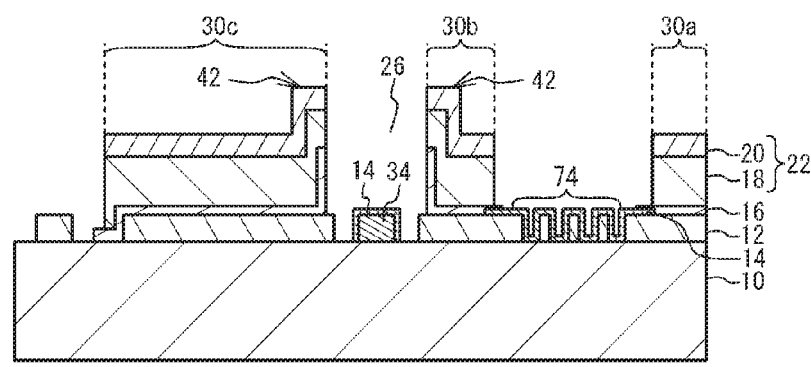
Figure 10A:
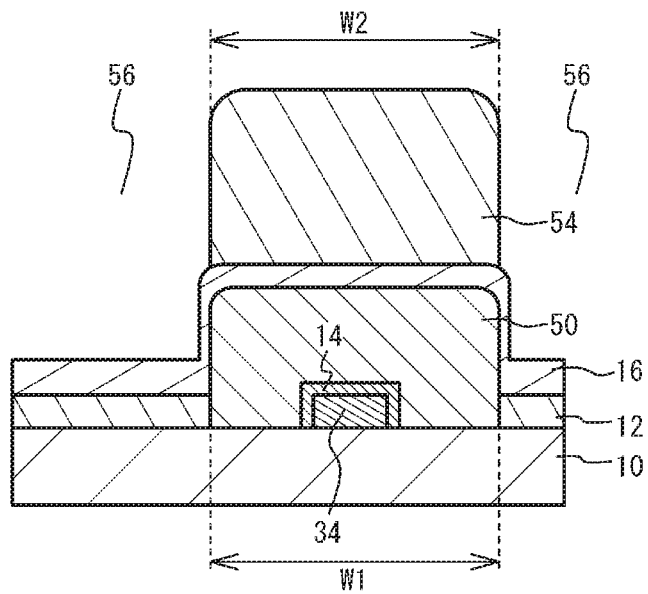
FIGS. 10A to 10C are cross-section views illustrating the method for manufacturing the acoustic wave device according to the second embodiment (part 4)
Figure 10B:
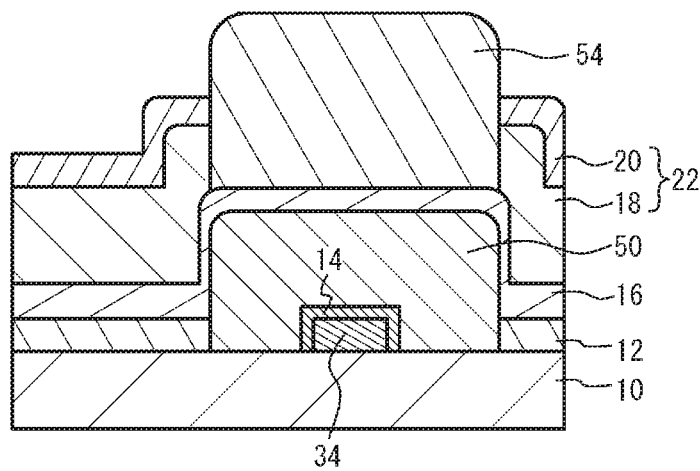
Figure 10C:
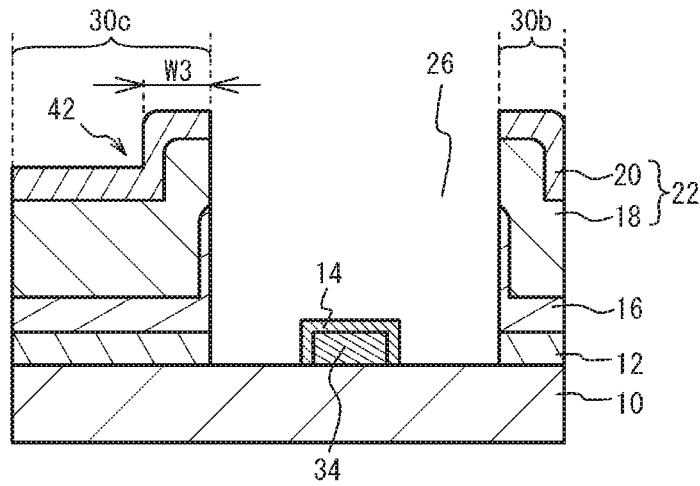

FIGS. 9A to 9C are cross-section views taken along the line A2 of FIG. 5. FIGS. 10A to 10C are enlarged views of a region in the vicinity of the wiring 32 of FIGS. 9A to 9C, respectively. As illustrated in FIGS. 9A and 10A, a width W2 of the mask layer 54 is made equal to or slightly smaller than a width W1 of the mask layer 50. Thereby, the seed layer 16 adjacent to side surfaces of the mask layer 50 is exposed to the openings 56. Here, the width W2 is preferably smaller than the width W from a viewpoint of an alignment precision.

As illustrated in FIGS. 9B and 10B, when the plating layer 22 is formed, the plating layer 22 is also formed on the seed layer 16 exposed to the openings 56. Thereby, upper surfaces of the plating layer 22 project upwardly. As illustrated in FIGS. 9C and 10C, the mask layers 50 and 54 and the seed layer 16 are removed by the lift-off method. Thereby, the projections 42 are formed on the edges of the wirings 30b and 30c near the space 26. A width W3 of each projection 42 is almost a half of the film thickness of the plating layer 22. When the film thickness of the plating layer 22 is 4 μm, the width W3 is about 2 μm. A ratio of the film thickness and the width W3 of the plating layer 22 can be properly set in accordance with a plating condition or the like.

Figure 11A:
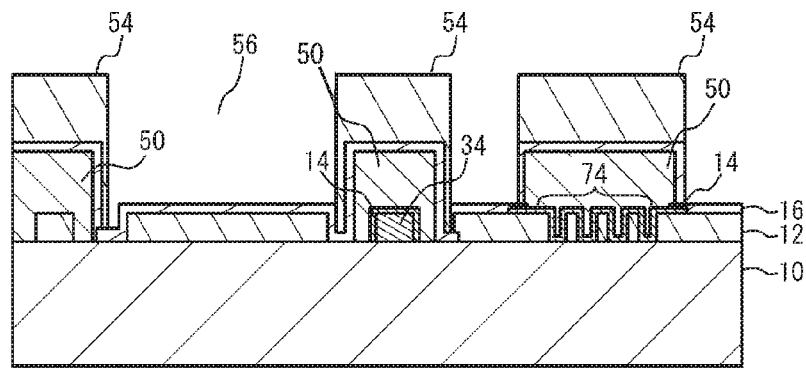
FIGS. 11A to 11C are cross-section views illustrating the method for manufacturing the acoustic wave device according to the second embodiment (part 5)
Figure 11B:
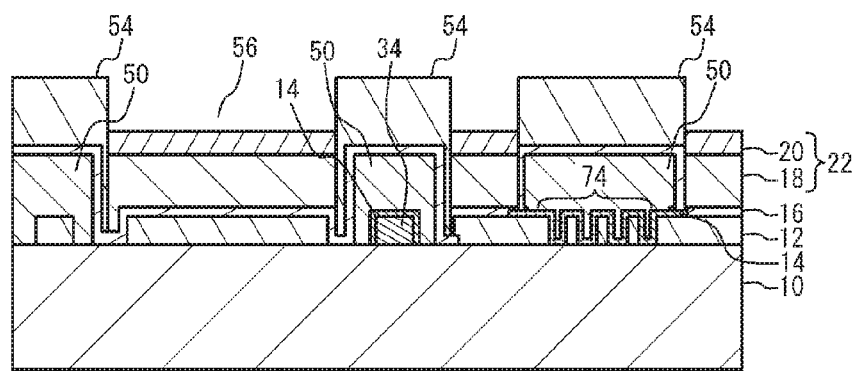
Figure 11C:
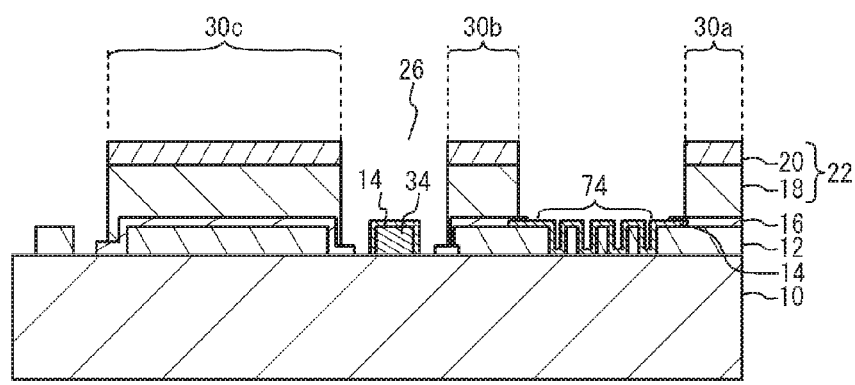
Figure 12A:
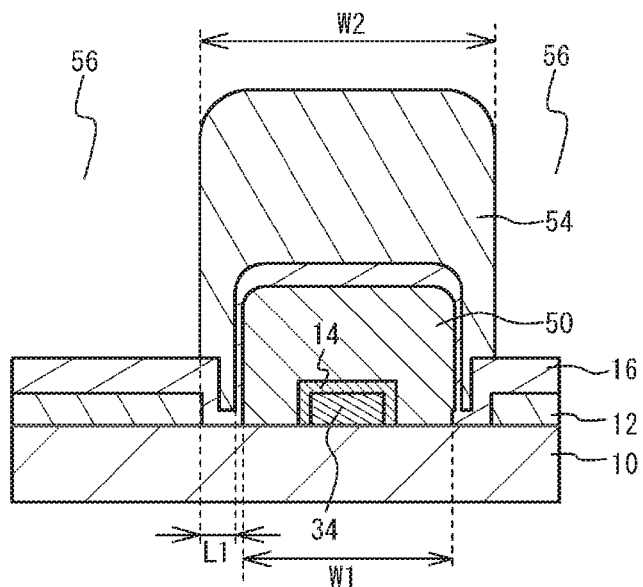
FIGS. 12A to 12C are cross-section views illustrating the method for manufacturing the acoustic wave device according to the second embodiment (part 6)
Figure 12B:
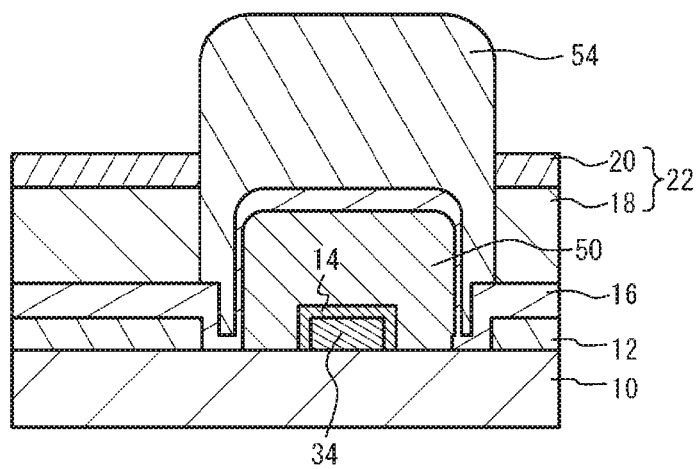
Figure 12C:
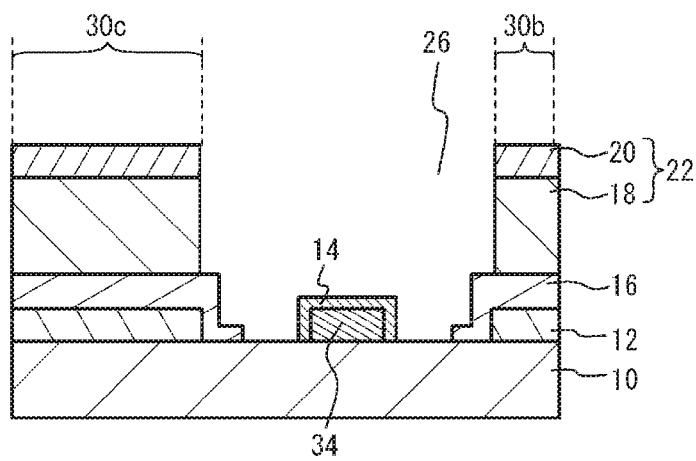

FIGS. 11A to 11C are cross-section views taken along the line A3 of FIG. 5. FIGS. 12A to 12C are enlarged views of a region in the vicinity of the wiring 32 of FIGS. 11A to 11C, respectively. As illustrated in FIGS. 11A and 12A, the width W2 of the mask layer 54 is made larger than the width W1 of the mask layer 50. Thereby, the seed layer 16 adjacent to side surfaces of the mask layer 50 is not exposed to the openings 56. An interval L1 between the side surface of the seed layer 16 and the side surface of the mask layer 54 is 0.5 µm to 2 µm, for example. The interval L1 is preferably set smaller in a range that the seed layer 16 is not exposed even when a deviation of the alignment occurs.

As illustrated in FIGS. 11B and 12B, when the plating layer 22 is formed, the plating layer 22 is not formed on the side surfaces of the seed layer 16. Thereby, the upper surfaces of the plating layer 22 near the side surfaces of the seed layer 16 are flat. As illustrated in FIGS. 11C and 12C, the mask layers 50 and 54 and the seed layer 16 are removed by the lift-off method. Thereby, the projections 42 are not formed on the edges of the wirings 30b and 30c near the space 26, and hence the upper surfaces of the wirings 30b and 30c are flat.

According to the second embodiment, as illustrated in FIG. 7A, the metal film 12 is formed on regions of the substrate 10 for the acoustic wave element 74, the wiring 30 and the wiring 34 to be formed. As illustrated in FIG. 7B, formed is the mask layer 50 (i.e., a first mask layer) in which the opening 52 (i.e., a first opening) is located on the metal film 12 in a region for the wiring 30 to be formed, and the opening 52 is not located on a region for the wiring 32 to be formed. As illustrated in FIG. 7C, the seed layer 16 is formed so as to contact the metal film 12 in the opening 52 and cover the mask layer 50. As illustrated in FIGS. 8A, 9A and 11A, formed is the mask layer 54 (i.e., a second layer) in which the opening 56 (i.e., a second opening) is located on the regions for the wirings 30 and 32 to be formed. As illustrated in FIGS. 8B, 9B and 11B, the plating layer 22 is formed on the seed layer 16 in the opening 56 by supplying the current from the seed layer 16. As illustrated in FIGS. 8C, 9C and 11C, the seed layer 16 in the outside of the opening 52 is lifted off by removing the mask layers 50 and 54. Thereby, the wiring 32 that is fixed to the wiring 30 and is formed on the wiring 34 via the air gap 24 can be provided.

As illustrated in FIGS. 9A and 10A, exposed to the opening 56 is the seed layer 16 which is located on the both sides of the region for the wiring 32 to be formed (as seen from the extension direction of the wiring 32) and is formed on the side surfaces of the mask layer 50. Thereby, in FIGS. 9B and 10B, the plating layer 22 grows up on the exposed seed layer 16. Therefore, the projections 42 which contact the fixer 40 can be formed by simple processes. In the projections 42 formed in this way, the seed layer 16 extends upwardly along the side surface of the edge of each of the wirings 30b and 30c, as illustrated in FIG. 10C.

In the edges of the wirings 30 on which the projections 42 are formed as illustrated in FIG. 10B, the seed layer 16 is not lifted off and remains at the time of the lift-off of FIG. 10C, and the organic solvent is hard to infiltrate into the mask layer 50. Therefore, when the mask layer 54 is formed as illustrated in FIGS. 11A and 12A, the mask layer 54 is formed so that a part of the seed layer 16 formed on the side surfaces of the mask layer 50 is not exposed to the opening 56. That is, the projection 42 is formed on a part of the edge of the wiring 30 as illustrates in FIG. 1A, and is not formed on a remain of the edge of the wiring 30. Thereby, the mask layer 54 covers the seed layer 16 formed on the side surfaces of the mask layer 50, as illustrated in FIG. 12B. Therefore, the exfoliation of the seed layer 16 becomes easy. As illustrated in FIG. 12C, in the side surface of the edge of the wiring 30 on which the projection 42 is not formed, the seed layer 16 does not extend upwardly.

Moreover, the wiring 30 includes the metal film 12, the seed layer 16 and the plating layer 22 which are formed on the substrate 10. The wiring 32 includes the seed layer 16 and the plating layer 22, but does not include the metal film 12. The wiring 34 includes the metal film 12, but does not include the seed layer 16 and the plating layer 22.

Figure 13:
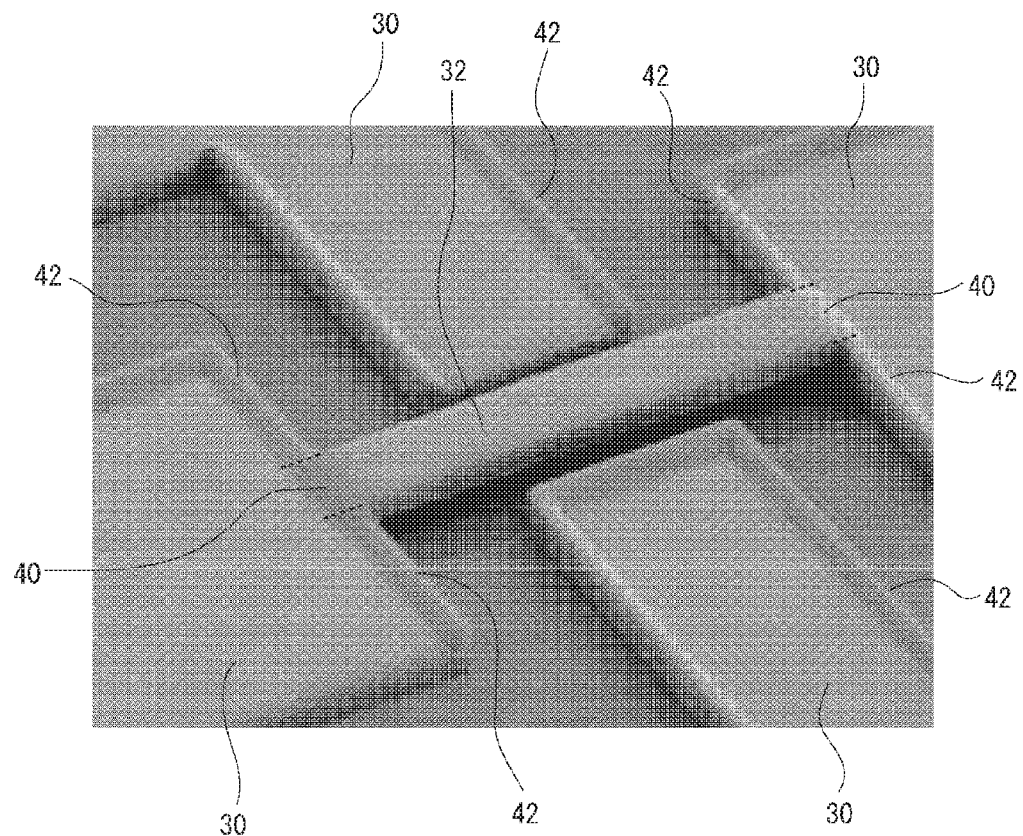
FIG. 13 is a SEM image in which wirings according to other example of the first and the second embodiments are captured from an oblique direction.

FIG. 13 is a SEM (Scanning Electron Microscope) image in which wirings according to other example of the first and the second embodiments are captured from an oblique direction. As illustrated in FIG. 13, the projections 42 are formed around each wiring 30. The fixer 40 for fixing the wiring 32 to the wiring 30 is formed on each root of the wiring 32. The projections 42 and the fixer 40 are formed continuously. The first and the second embodiments mainly explain an example in which the wiring 32 is located above the wiring 34 via the air gap 24 so as to intersect the wiring 34. As illustrated in FIG. 13, the wiring 32 may be formed above the substrate 10 via an air gap, and the wiring 32 does not need to be formed so as to stride across the wiring 34. Also, the projections 42 may exist on all the edges of each wiring 30.

In the second embodiment, the surface acoustic wave device is explained as an example of the acoustic wave element, but the acoustic wave element may be an acoustic boundary wave element, a love wave element, a piezoelectric thin film resonant element, or the like. Moreover, the receiving filter using the DMS filters is explained as an example of the acoustic wave device, but the acoustic wave device may be a filter such as a transmitting filter, or may be a ladder-type filter.

Although the embodiments of the present invention have been described in detail, the present invention is not limited to these specific embodiments, and the various changes, substitutions, and alterations could be made hereto without departing from the spirit and scope of the invention.

What is claimed is:

1. An acoustic wave device comprising:
    a substrate;
    an acoustic wave element that is formed on the substrate;
    a first wiring that is formed on the substrate and electrically connected to the acoustic wave element;
    a second wiring that is formed above the substrate via an air gap, and includes an edge fixed to the first wiring;
    a fixer that is formed on an edge of the first wiring, projects upwardly, and is fixed to the second wiring; and
    a projection that contacts the fixer, projects upwardly, and is formed on the edge of the first wiring and on an outside of the second wiring in a direction intersecting an extension direction of the second wiring.

2. The acoustic wave device as claimed in claim 1, wherein each of the first wiring and the second wiring includes a seed layer and a plating layer formed on the seed layer, and the seed layer extends upwardly along a side surface of the projection.

3. The acoustic wave device as claimed in claim 1, wherein
    the projection is formed on a part of an edge of the first wiring and is not formed on a remain of the edge of the first wiring.

4. The acoustic wave device as claimed in claim 3, wherein
   each of the first wiring and the second wiring includes a seed layer and a plating layer formed on the seed layer,
   the seed layer extends upwardly along a side surface of the projection, and
   the seed layer does not extend upwardly in a side surface of the edge of the first wiring on which the projection is not formed.

5. The acoustic wave device as claimed in claim 1, further comprising:
   a third wiring formed on the substrate;
   wherein the second wiring is formed above the third wiring via an air gap.

6. The acoustic wave device as claimed in claim 5, wherein
   the first wiring includes a metal film formed on the substrate, a seed layer formed on the metal film, and a plating layer formed on the seed layer,
   the second wiring includes the seed layer and the plating layer without including the metal film, and
   the third layer includes the metal film without including the seed layer and the plating layer.

7. A method for manufacturing an acoustic wave device, comprising:
   forming a metal film on a first region of a substrate for an acoustic wave element to be formed and a second region of the substrate for a first wiring to be formed, the first wiring being electrically connected to the acoustic wave element;
   forming, on the substrate, a first mask layer in which a first opening is located on the metal film in the second region and is not located on a third region for a second wiring to be formed;
   forming a seed layer so as to contact the metal film in the first opening and cover the first mask layer;
   forming a second mask layer in which a second opening is located on the second region and the third region on the seed layer so that a part of the seed layer is exposed to the second opening, the part of the seed layer being located on both sides of the third region in an extension direction of the second wiring and being formed on a side surface of the first mask layer;
   forming a plating layer on the seed layer in the second opening by supplying a current from the seed layer; and
   lifting off the seed layer in the outside of the first opening by removing the first mask layer and the second mask layer.

8. The method for manufacturing the acoustic wave device, as claimed in claim 7, wherein
   the forming the second mask layer includes forming the second mask so that another part of the seed layer formed on the side surface of the first mask layer is not exposed to the second opening.

\* \* \* \* \*